United States Patent
Chiu et al.

(10) Patent No.: US 9,312,658 B2
(45) Date of Patent: Apr. 12, 2016

(54) OPTOELECTRONIC MODULE AND METHOD FOR MANUFACTURING THE SAME

(71) Applicant: ADVANCED OPTOELECTRONIC TECHNOLOGY, INC., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/482,942

(22) Filed: Sep. 10, 2014

(65) Prior Publication Data

US 2015/0115218 A1 Apr. 30, 2015

(30) Foreign Application Priority Data

Oct. 31, 2013 (CN) .......................... 2013 1 05265894

(51) Int. Cl.

| | |
|---|---|
| *H01L 27/15* | (2006.01) |
| *H01S 5/026* | (2006.01) |
| *H01S 5/10* | (2006.01) |
| H01L 33/10 | (2010.01) |
| H01S 5/343 | (2006.01) |
| H01S 5/02 | (2006.01) |
| H01L 33/40 | (2010.01) |

(52) U.S. Cl.
CPC ................ *H01S 5/026* (2013.01); *H01L 27/15* (2013.01); *H01S 5/105* (2013.01); H01L 33/10 (2013.01); H01L 33/405 (2013.01); H01S 5/0213 (2013.01); H01S 5/34333 (2013.01)

(58) Field of Classification Search
CPC ................................ H01L 27/15; H01S 5/026
USPC .......................................................... 372/50.1
See application file for complete search history.

(56) References Cited

U.S. PATENT DOCUMENTS 4,325,034 A * 4/1982 Dyment et al. .............. 372/50.1

FOREIGN PATENT DOCUMENTS

EP 1035623 A1 9/2000

* cited by examiner

*Primary Examiner* — Mark Prenty
(74) *Attorney, Agent, or Firm* — Novak Druce Connolly Bove + Quigg LLP

(57) ABSTRACT

An optoelectronic module includes a substrate, an LED and a laser LED formed on the substrate, simultaneously. A method for manufacturing an optoelectronic module includes following steps: providing a sapphire substrate, and forming two adoped GaN layers, an N-type GaN layer, an active layer and a P-type GaN layer on the sapphire substrate in sequence; providing a substrate and forming a metallic adhering layer on the substrate; forming an ohmic contact layer and a reflecting layer on the P-type GaN layer in series; arranging the reflecting layer on the adhering layer; stripping the sapphire substrate and the two doped GaN layers from the N-type GaN layer to form a semiconductor structure; etching a top end of the semiconductor structure to divide the semiconductor structure into a laser LED region and an LED region; forming two N-type electrodes on the LED region and an LED region, respectively.

9 Claims, 10 Drawing Sheets

OPTOELECTRONIC MODULE AND METHOD FOR MANUFACTURING THE SAME

FIELD

The present disclosure generally relates to an optoelectronic module and a method for manufacturing the optoelectronic module.

BACKGROUND

A typical optoelectronic integrated circuit includes a plurality of LEDs and laser LEDs to emit different signals. However, the LEDs and the laser LEDs are independent and spaced from each other. The LEDs and laser LEDs may occupy too much area on the optoelectronic integrated module.

BRIEF DESCRIPTION OF THE DRAWINGS

Implementations of the present technology will now be described, by way of example only, with reference to the attached figures.

DETAILED DESCRIPTION

Figure 1:
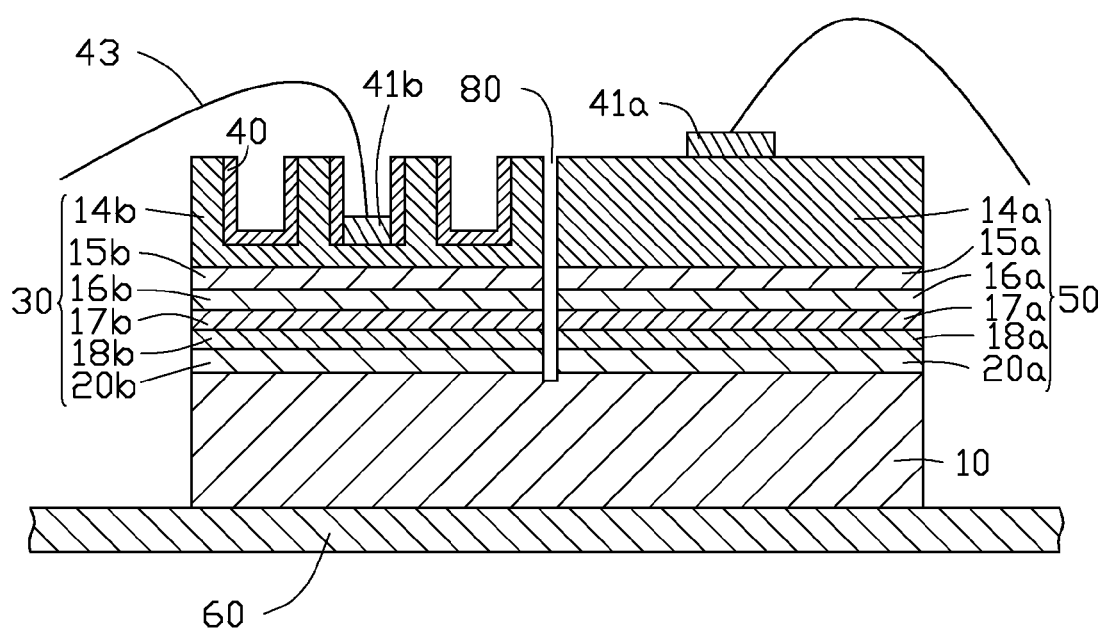
FIG. 1 is a cross sectional view of an optoelectronic module according to an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising," when utilized, means "including, but not necessarily limited to"; it specifically indicates open-ended inclusion or membership in the so-described combination, group, series and the like.

Referring to FIG. 1, an optoelectronic module in accordance with an exemplary embodiment of the disclosure includes a substrate 10, a laser LED 30 and an LED 50 formed on the substrate 10, simultaneously. The LED 30 is located at a side of the laser LED 50 and is spaced from the laser LED 50. The substrate 10 is an electrically insulating layer and mounted on an optoelectronic integrated circuit 60.

The LED 50 includes an adhering layer 20a, a reflecting layer 18a, an ohmic contact layer 17a, a P-type GaN layer 16a, an active layer 15a, an un-etched N-type GaN layer 14a formed on substrate 10 in series, and an N-type electrode 41a formed on the N-type GaN layer 14a. The laser LED 30 includes an adhering layer 20b, a reflecting layer 18b, an ohmic contact layer 17b, a P-type GaN layer 16b, an active layer 15b, an etched N-type GaN layer 14b formed on the substrate 10 in series, and an N-type electrode 41b formed on the N-type GaN layer 14b.

Figure 2:
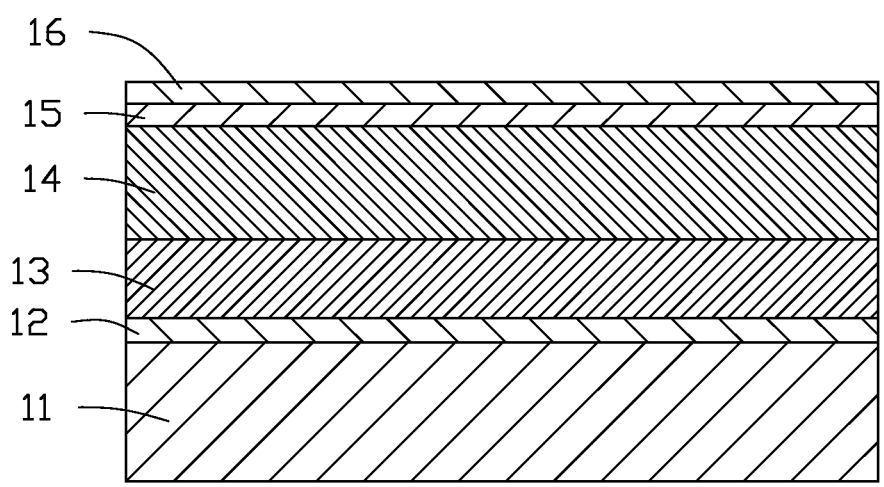
FIG. 2 is a schematic view showing a first step of a method for manufacturing the optoelectronic module of FIG. 1.

A method for manufacturing the optoelectronic module includes following steps:

Referring to FIG. 2, the first step is providing a sapphire substrate 11, and forming a doped GaN layer 12 under low temperature, a doped GaN layer 13 under high temperature, an N-type GaN layer 14, an active layer 15 and a P-type GaN layer 16 on the sapphire substrate 11 in sequence from bottom to top.

Figure 3:
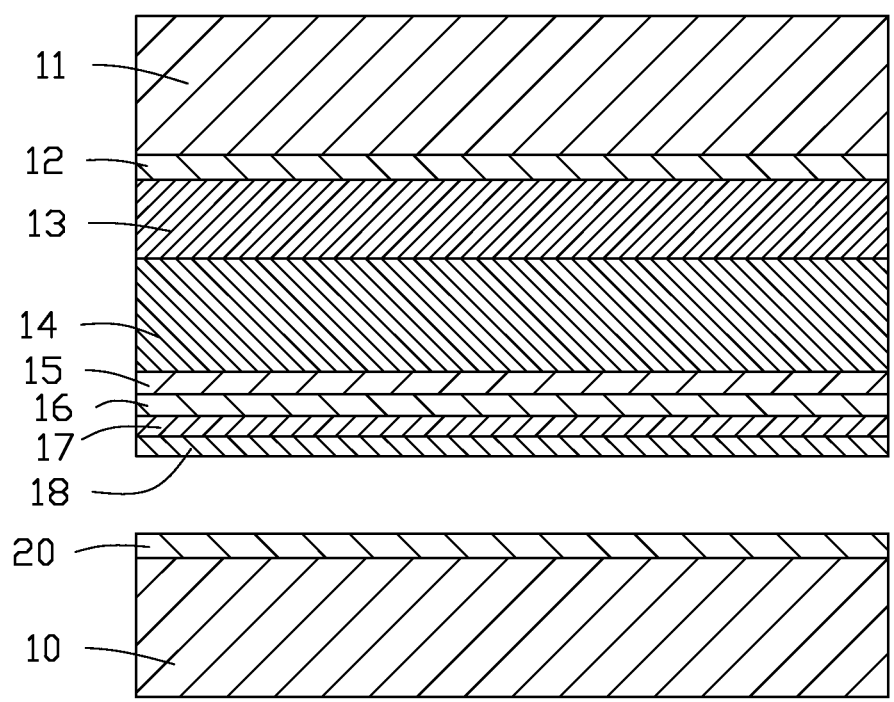
FIG. 3 is a schematic view showing a second step of a method for manufacturing the optoelectronic module of FIG. 1.

Referring to FIG. 3, the second step is providing the substrate 10 and forming a metallic adhering layer 20 on the substrate 10 by plating; forming an ohmic contact layer 17 and a reflecting layer 18 on the P-type GaN layer 16 in series. The reflecting layer 18 is a metallic layer or a bragg reflection layer. In this embodiment, the reflecting layer 18 is a bragg reflection layer.

Figure 4:
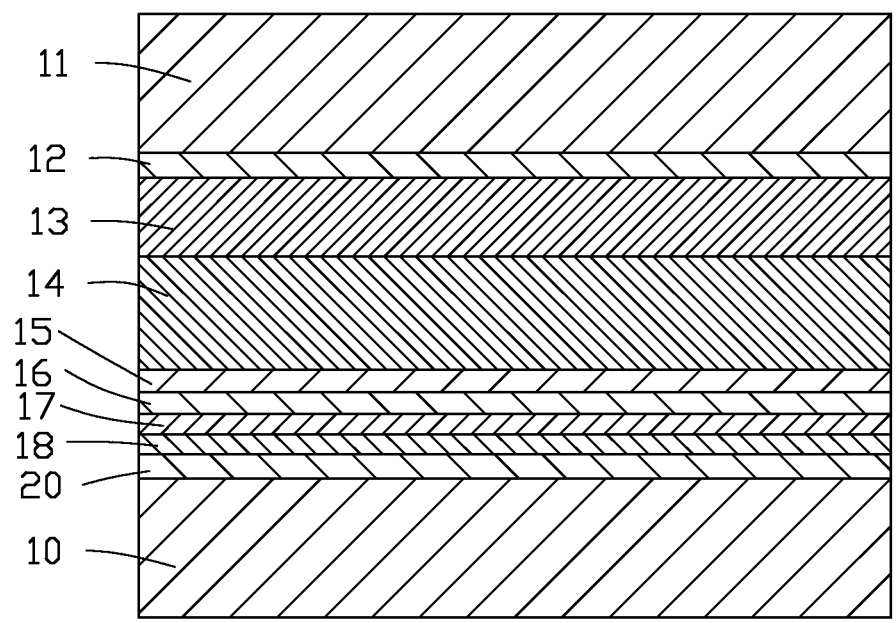
FIG. 4 is a schematic view showing a third step of a method for manufacturing the optoelectronic module of FIG. 1.

Referring to FIG. 4, the third step is arranging the reflecting layer 18 on the adhering layer 20 and pressing the reflecting layer 18 to the adhering layer 20 by 3000 to 7000 N under 200 to 400 degrees Celsius to make the reflecting layer 18 be bonded on the adhering layer 20. Preferably, the reflecting layer 18 is pressed by 6000 N under 300 degrees Celsius.

Figure 5:
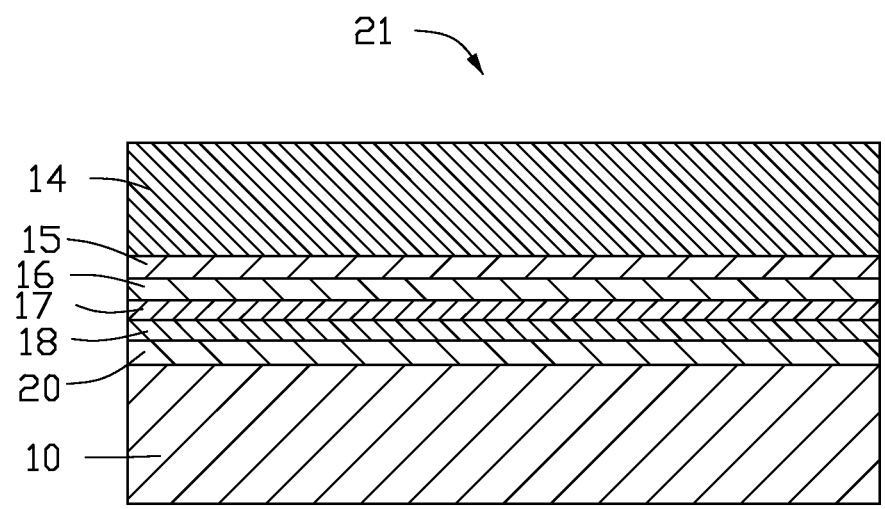
FIG. 5 is a schematic view showing a fourth step of a method for manufacturing the optoelectronic module of FIG. 1.

Referring to FIG. 5, the fourth step is stripping the sapphire substrate 11, the doped GaN layer 12 and the doped GaN layer 13 from the N-type GaN 14. Thus, a semiconductor structure 21 is obtained which comprising the substrate 10, the adhering layer 20, the reflecting layer 18, the ohmic contact layer 17, the P-type GaN layer 16, the active layer 15 and the N-type GaN layer 14. The adhering layer 20, the reflecting layer 18, the ohmic contact layer 17, the P-type GaN layer 16, the active layer 15 and the N-type GaN layer 14 are formed on the substrate 10 in series.

Figure 6:
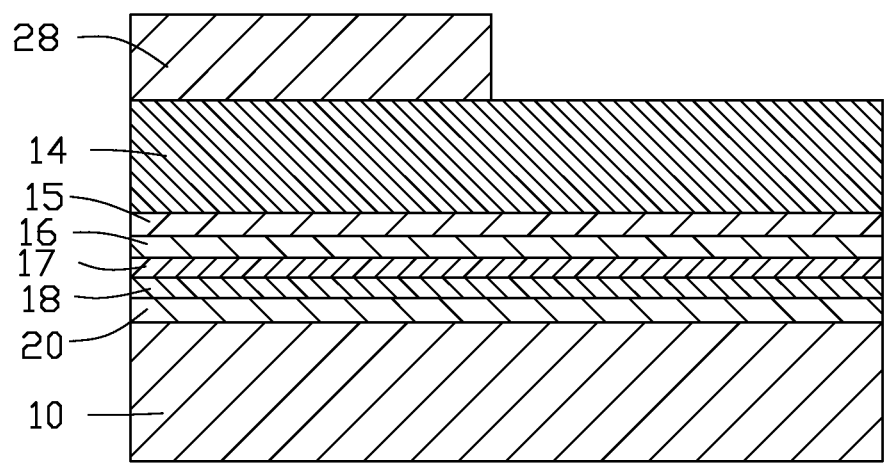
FIGS. 6-7 is a schematic view showing a fifth step of a method for manufacturing the optoelectronic module of FIG. 1.
Figure 7:
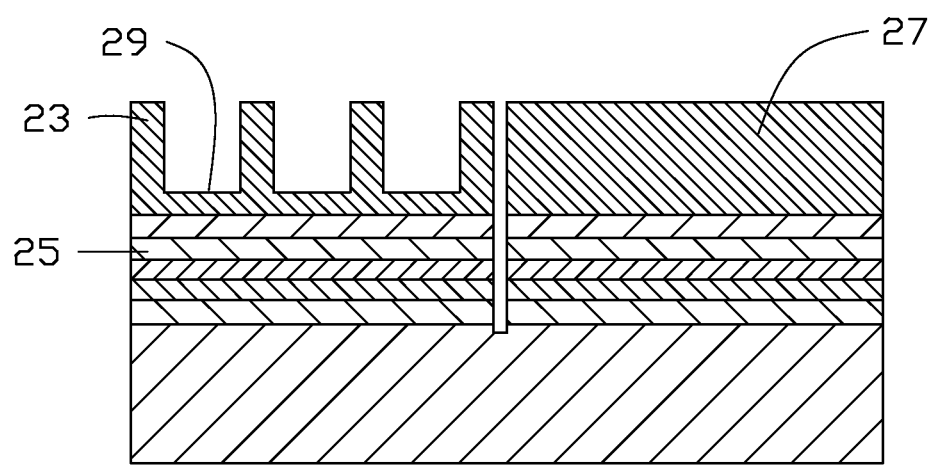

Referring to FIGS. 6-7, the fifth step is etching a top end of the semiconductor structure 21 to divide the semiconductor structure 21 into a laser LED region 25 and an LED region 27.

Specifically, forming a photoresist layer 28 on a left side of a top surface of the N-type GaN layer 14 and etching the photoresist layer 28 to divide the photoresist layer 28 into a plurality of spaced photoresist portions and then etching the semiconductor structure 21 along the space between the photoresist portions until a top end of the left side of the N-type GaN layer 14 is etched to form a plurality of nano poles 23, and then taking off the photoresist portions. The photoresist layer 28 is etched by acid solution or irradiation of yellow light. A middle of the semiconductor structure 21 is etched along a height direction of the semiconductor structure 21 to a top end of the substrate 10 to form a gap 80. The gap 80 separates a left part having the nano poles 23, which is the laser LED region 25, from a right part having no nano poles 23, which is the LED region 27. A bottom portion of the left side of the N-type GaN layer 14 which is not etched is configured as a support portion 29 to support the nano poles 23. The nano poles 23 extend from a top surface of the supporting portion 29.

Figure 8:
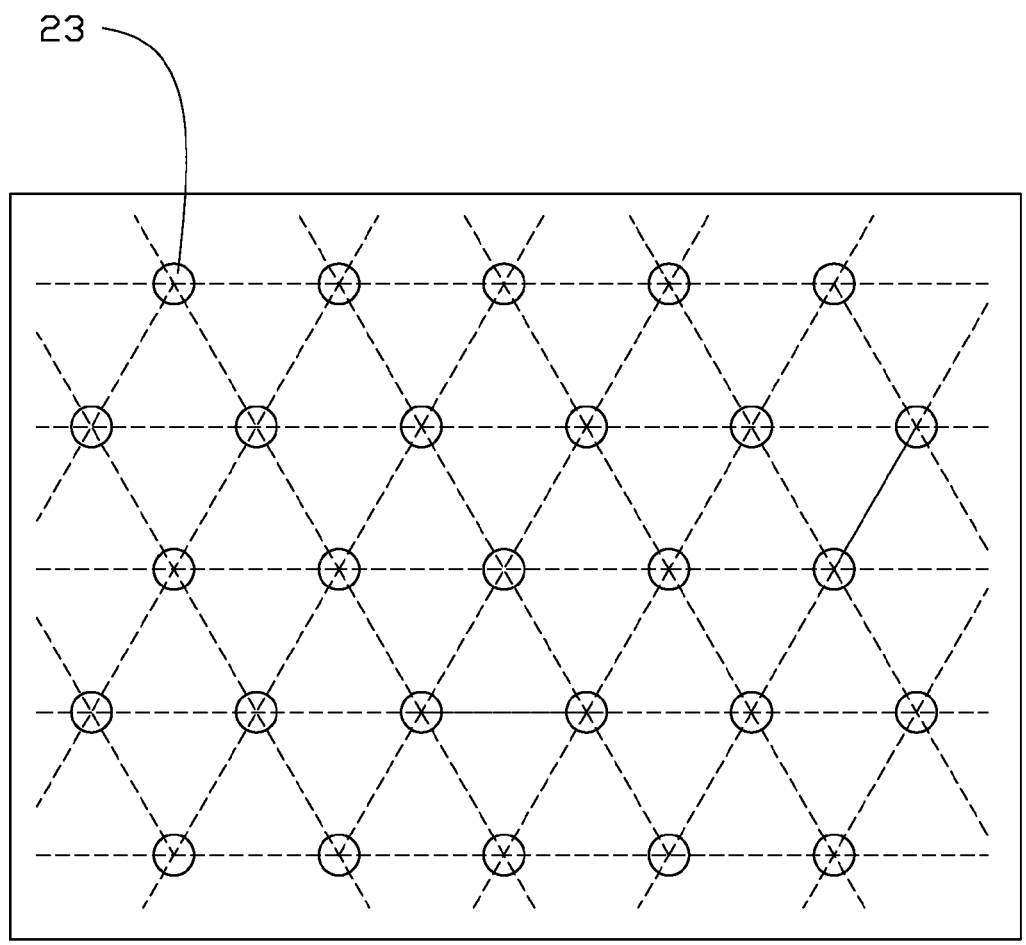
FIG. 8 shows nano poles of the optoelectronic module in this embodiment.
Figure 9:
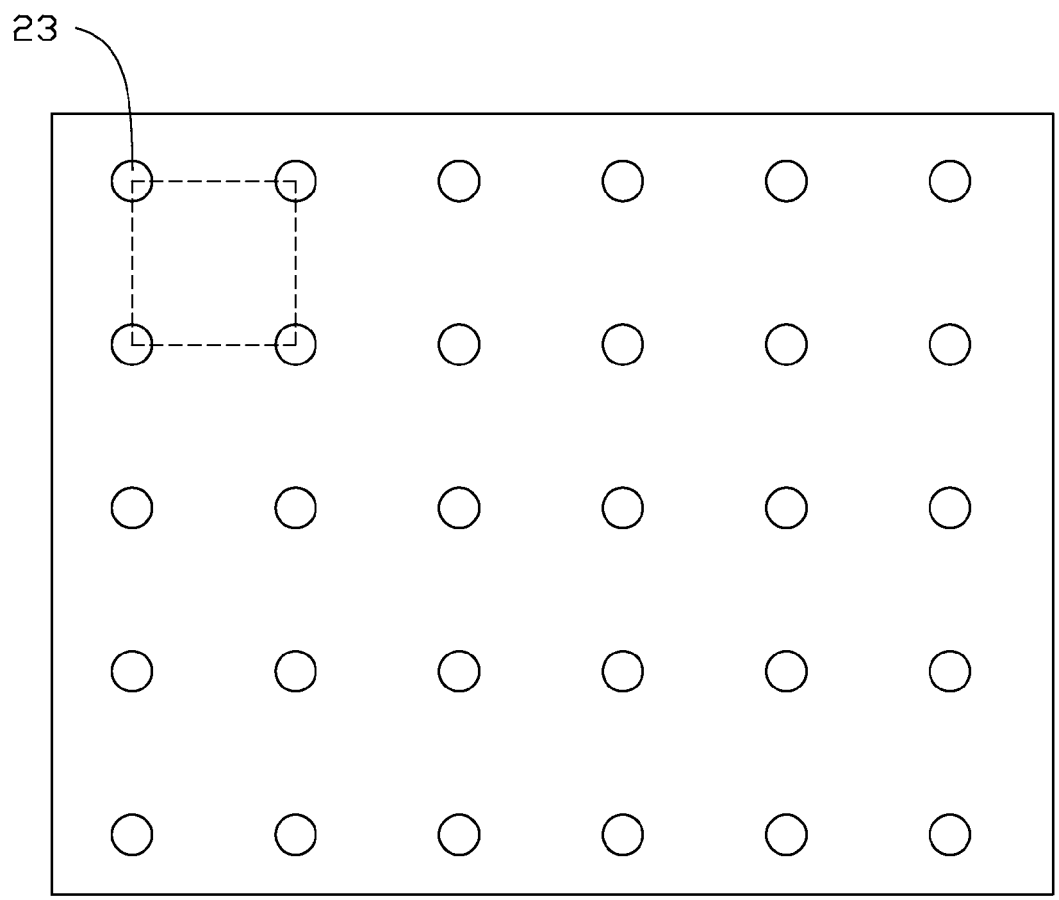
FIG. 9 shows nano poles of the optoelectronic module in an alternative embodiment.

Referring to FIG. 8, each nano pole 23 is cylindrical and a diameter thereof is varied between 20 nanometer to 100 nanometer. Preferably, the diameter of each nano pole 23 is 50 nanometer. A height of each nano pole 23 is varied between 100 nanometer to 500 nanometer. Preferably, the height of each nano pole 23 is 200 nanometer. The nano poles 23 are spaced from each other. A distance between each two adjacent nano poles 23 is varied between 50 nanometer to 500 nanometer. Preferably, the distance is 200 nanometer. The nano poles 23 are arranged regular, for example, as shown in FIG. 8, the nano poles 23 are arranged to define a plurality of connected hexagons and each hexagon has one nano pole 23 acting as a central thereof; as shown in FIG. 9, in an alternative embodiment, the nano poles 23 can be arranged in matrix to define a plurality of rectangles.

Figure 10:
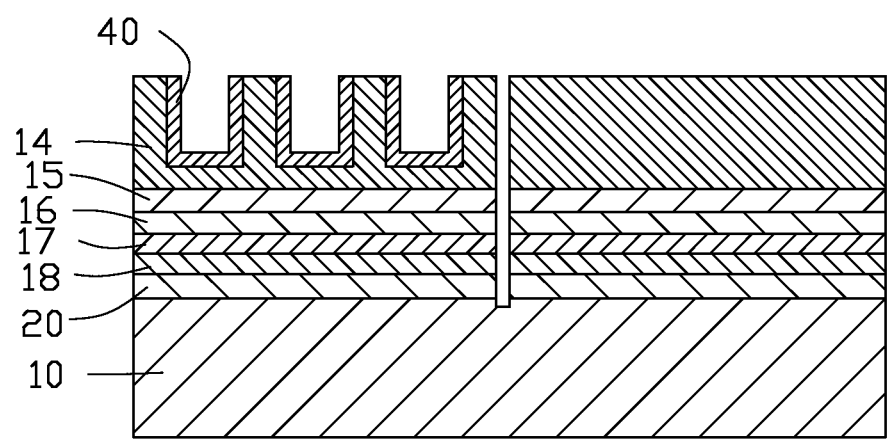
FIG. 10 is a schematic view showing a sixth step of a method for manufacturing the optoelectronic module of FIG. 1.

Referring to FIG. 10, the sixth step is coating a metallic film 40 on the nano poles 23 and the exposed part of the top surface of the support portion 29.

Referring to FIG. 1 again, the seventh step is etching a part of the metallic film 40 located at any two adjacent nano poles 23 to expose the supporting portion 29, and forming the N-type electrode 41b on the exposed supporting portion 29, and the N-type electrode 41a on a top end of the LED region 27, and bonding wires 43 on the N-type electrodes 41a, 41b, respectively. In this state, the optoelectronic module is manufactured completely.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An optoelectronic module comprising:
   a substrate; and
   an LED and a laser LED simultaneously formed on the substrate; and
   wherein the LED comprises an adhering layer, a reflecting layer, an ohmic contact layer, a P-type GaN layer, an active layer, an un-etched N-type GaN layer formed on the substrate in series; and the laser LED comprises an adhering layer, a reflecting layer, an ohmic contact layer, a P-type GaN layer, an active layer, and an etched N-type GaN layer formed on the substrate in series; and a gap is defined between the LED and the laser LED to separate the adhering layer, the reflecting layer, the ohmic contact layer, the P-type GaN layer, the active layer, the un-etched N-type GaN layer of the LED from the adhering layer, the reflecting layer, the ohmic contact layer, the P-type GaN layer, the active layer, and the etched N-type GaN layer of the laser LED.

2. The optoelectronic module of claim 1, wherein the LED is located at a side of the laser LED and is spaced from the laser LED.

3. The optoelectronic module of claim 1, wherein a top end of the N-type GaN layer of the laser LED being etched to form a plurality of nano poles.

4. The optoelectronic module of claim 3, wherein each nano pole is cylindrical and a diameter thereof is varied between 20 nanometer to 100 nanometer.

5. The optoelectronic module of claim 4, wherein the diameter of each nano pole is 50 nanometer.

6. The optoelectronic module of claim 3, wherein the nano poles are spaced from each other.

7. The optoelectronic module of claim 6, wherein a distance between each two adjacent nano poles is varied between 50 nanometer to 500 nanometer.

8. The optoelectronic module of claim 3, wherein a height of each nano pole is varied between 100 nanometer to 500 nanometer.

9. The optoelectronic module of claim 3, wherein the nano poles are arranged regular.

\* \* \* \* \*